(12) United States Patent
Green et al.

(10) Patent No.: US 8,803,560 B2
(45) Date of Patent: Aug. 12, 2014

(54) AUDIO FREQUENCY DEVICE FOR AUDIBLE EYES OFF MEASUREMENTS

(75) Inventors: Samuel I. Green, St. Louis, MO (US); Raymond W. Bosenbecker, Jr., Chesterfield, MO (US)

(73) Assignee: The Boeing Company, Chicago, IL (US)

( * ) Notice: Subject to any disclaimer, the term of this patent is extended or adjusted under 35 U.S.C. 154(b) by 1252 days.

(21) Appl. No.: 12/242,175

(22) Filed: Sep. 30, 2008

(65) Prior Publication Data
US 2010/0079131 A1    Apr. 1, 2010

(51) Int. Cl.
*H03C 3/00*    (2006.01)
(52) U.S. Cl.
USPC .......................................... 327/101; 381/337
(58) Field of Classification Search
USPC ........................................................ 327/101
See application file for complete search history.

(56) References Cited

U.S. PATENT DOCUMENTS

| | | | | |
|---|---|---|---|---|
| 4,160,206 | A * | 7/1979 | Bojarski | 324/133 |
| 5,193,108 | A * | 3/1993 | Stocklin | 379/21 |
| 5,319,306 | A * | 6/1994 | Schuyler | 324/133 |
| 5,729,335 | A | 3/1998 | Green | |
| 6,984,995 | B2 * | 1/2006 | Lawrence | 324/706 |
| 7,184,899 | B2 * | 2/2007 | Cruz | 702/57 |
| 2006/0012476 | A1 | 1/2006 | Markhovsky et al. | |
| 2006/0148423 | A1 | 7/2006 | Sharpe | |
| 2006/0258320 | A1 | 11/2006 | Huang | |
| 2008/0007404 | A1 | 1/2008 | Albert et al. | |

OTHER PUBLICATIONS

USPTO office action for U.S. Appl. No. 12/017,224 dated Mar. 1, 2010.
"Report on Electromagnetic Compatibility Between Passenger Carried Portable Electronic Devices (PEDS) and Aircraft Systems", Nov. 2003, The European Organisation for Civil Aviation Equipment, Paris, France, pp. 77-79.
"0.1 GHz to 2.5 GHz 70 dB Logarithmic Detector/Controller AD8313", Analog Devices, 2004, pp. 1-24.
"LM31A/LM231/LM331A/LM331 Precision voltage-to-Frequency Converters" National Semiconductor, Apr. 2006, pp. 1-15.
Green, "Bit error rate test accessory makes errors audible", Dec. 2001 Review of Scientific Instruments, vol. 72, No. 12, pp. 4472-4473.
U.S. Appl. No. 12/017,224, filed Jan. 21, 2008, Green.

* cited by examiner

*Primary Examiner* — Benjamin Sandvik
(74) *Attorney, Agent, or Firm* — Yee & Associates, P.C.

(57) ABSTRACT

An electrical to audible signal measurement apparatus comprises an absolute value converter, a voltage to frequency converter, a polarity detector, and a waveform changer. The absolute value converter is capable of converting a bipolar input signal into a unipolar signal. The voltage to frequency converter is connected to the absolute value converter and is capable of generating a frequency signal proportional to the unipolar signal. The polarity detector is capable of identifying a polarity of the bipolar input signal to form an identified polarity. The waveform changer is connected to the voltage to frequency converter and polarity detector and is capable of generating a number of different waveforms in an audio frequency range in response to receiving the frequency signal from the voltage to frequency converter and in response to the identified polarity.

24 Claims, 7 Drawing Sheets

AUDIO FREQUENCY DEVICE FOR AUDIBLE EYES OFF MEASUREMENTS

BACKGROUND INFORMATION

1. Field

The present disclosure relates generally to measurement devices, and in particular, to a method and apparatus for making electrical measurements.

2. Background

With electrical systems, it is often desirable to perform measurements during testing and trouble-shooting of circuit systems. One device used for making measurements is a digital multimeter or digital multitester. This type of device is a digital version of the classical analog volt-ohm meter. A multimeter may include various features that provide a capability to measure parameters such as, for example, voltage, current, resistance, capacitance, inductance, temperature, and other suitable parameters. A digital multimeter incorporates a digital display often called a digital meter or a digital panel meter. A digital multimeter converts all measured parameters to a consistent voltage range acceptable to the digital panel meter. This invention is useful to all instruments that incorporate digital panel meters, including digital multimeters.

When performing measurements, it may be inconvenient to monitor or watch the visual display of a multimeter while using the visual sense to control manual placement of the probes at the test points of the circuit system. Further, it may be difficult to monitor the visual display of the multimeter constantly to identify that a change occurs during testing, especially when using the visual sense to make changes to a circuit system by performing some adjustment.

Therefore, it would be advantageous to have a method and apparatus for performing electrical measurements in a circuit system that provide useful data to the aural sense so that the visual sense is available for other tasks.

SUMMARY

In one advantageous embodiment, an electrical to audible signal measurement apparatus comprises an absolute value converter, a voltage to frequency converter, a polarity detector, and a waveform changer. The absolute value converter is capable of converting a bipolar input signal into a unipolar signal. The voltage to frequency converter is connected to the absolute value converter and is capable of generating a frequency signal proportional to the unipolar signal. The polarity detector is capable of identifying a polarity of the bipolar input signal to form an identified polarity. The waveform changer is connected to the voltage to frequency converter and polarity detector and is capable of generating a number of different waveforms in an audio frequency range in response to receiving the frequency signal from the voltage to frequency converter and in response to the identified polarity.

In another advantageous embodiment, an apparatus is present comprising an absolute value circuit, a polarity detector, and a frequency generation circuit. The absolute value circuit is capable of converting a bipolar input signal into a unipolar signal. The polarity detector is capable of identifying a polarity of the bipolar input signal. The frequency generation circuit is capable of generating a plurality of different waveforms, each having an audio frequency based on a magnitude of the bipolar input signal and a sound based on a polarity of the bipolar input signal.

In yet another advantageous embodiment, a method is present for presenting electrical measurement. The method includes receiving a bipolar signal to form a bipolar input signal. The method also includes identifying the polarity of the bipolar input signal. The method includes converting the bipolar input signal to a unipolar signal. Additionally, the method includes generating a frequency signal proportional to the unipolar signal. The method also includes generating a particular waveform from a plurality of possible waveforms using the frequency signal and the polarity of the bipolar input signal. Further, the method includes converting the particular waveform to an audible tone.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features characteristic of the advantageous embodiments are set forth in the appended claims. The advantageous embodiments, however, as well as a preferred mode of use, further objectives and advantages thereof, will best be understood by reference to the following detailed description of an advantageous embodiment of the present disclosure when read in conjunction with the accompanying drawings, wherein:

DETAILED DESCRIPTION

The different advantageous embodiments recognize that the traditional display provided by digital multimeters and other visual display meters may be difficult or too distracting to monitor while performing measurements at different locations or making adjustments to a circuit. These measurements may be difficult because a user must look at the circuit to make changes or adjustments to the circuit or control the measurement locations, while also looking at the display of the digital multimeter or other visual display meters to see whether the changes or adjustments result in any measurement changes.

Thus, the different advantageous embodiments provide a method and apparatus for presenting electrical measurements to a user in a manner that allows the user to free their eyes for other tasks. These other tasks include, for example, the manipulation of tools to perform fine adjustments to a circuit, change components, or change measurement locations.

The different advantageous embodiments provide a method and apparatus for audibly presenting measurements to a user that allows a user to distinguish between positive and negative measurement indications in addition to signal amplitude indications.

The different advantageous embodiments convert measured signal amplitude to audio frequency or pitch. This conversion is very useful, as the human ear easily discerns small variations.

The different advantageous embodiments may also replace and improve the bar graph display currently built into modern digital multimeters as a crude and unsatisfactory means to provide an analog display, characteristic of earlier analog instruments. The use of audio frequency indication offers the same intuitive interpretation of changes as earlier analog display multimeters but offers vastly more resolution due to the sensitivity of the human ear to changes in pitch. The different advantageous embodiments supplant the visual bar graph display with a method that also conveys input signal polarity in an intuitive manner.

Figure 1:
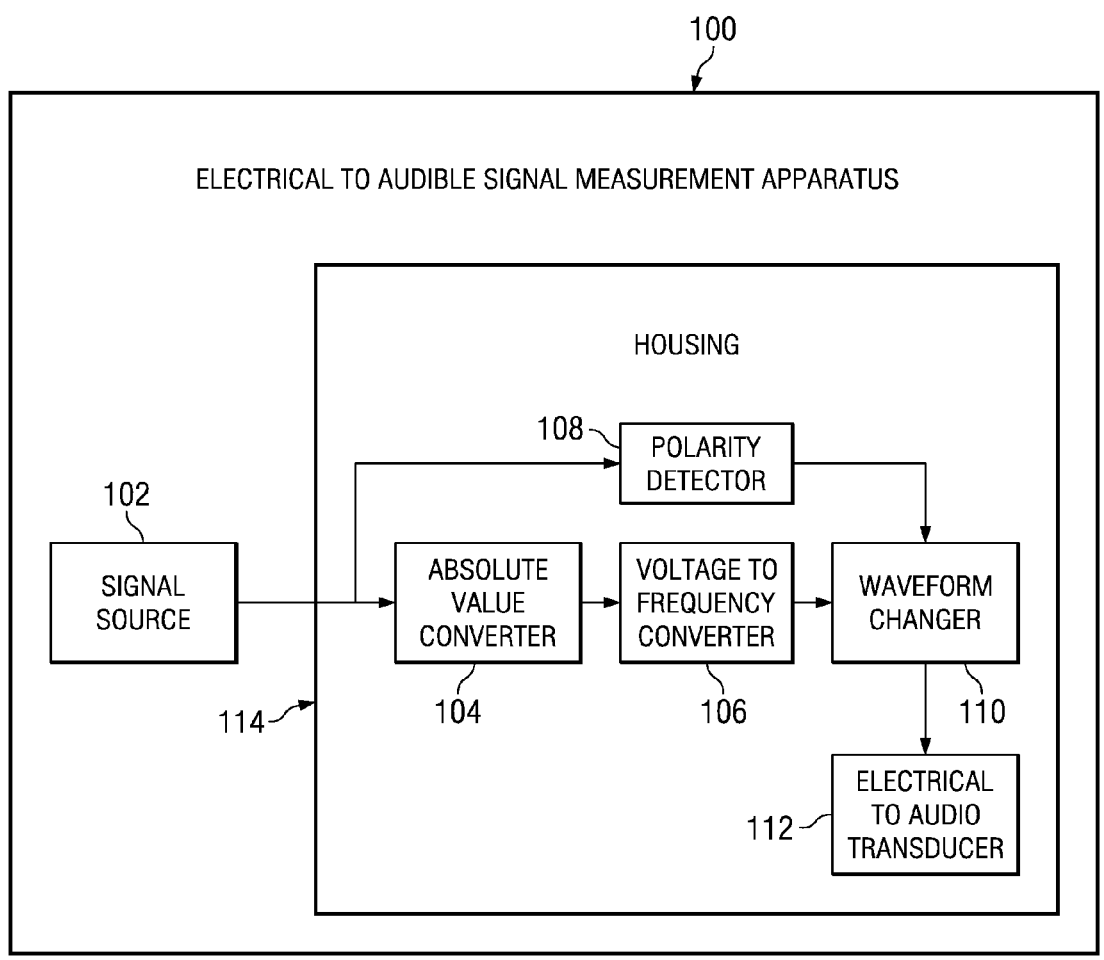
FIG. 1 is a block diagram of an electrical to audible signal measurement apparatus depicted in accordance with an advantageous embodiment.

With reference now to the figures, and in particular with reference to FIG. 1, a block diagram of an electrical to audible signal measurement apparatus is depicted in accordance with an advantageous embodiment. FIG. 1 is a high-level block diagram of electrical to audible signal measurement apparatus 100 and is not meant to show or imply physical architectures for different advantageous embodiments.

Electrical to audible signal measurement apparatus 100 includes signal source 102, absolute value converter 104, voltage to frequency converter 106, polarity detector 108, waveform changer 110, and electrical to audio transducer 112. In these examples, absolute value converter 104, voltage to frequency converter 106, polarity detector 108, waveform changer 110, and electrical to audio transducer 112 are located within housing 114.

In these illustrative examples, signal source 102 may take the form of an input signal such as, for example, a bipolar input signal, a unipolar input signal, or some other appropriate input signal within a digital multimeter. Signal source 102 may be presented within the digital multimeter. For example, the bipolar input signal may be presented as an input to a digital panel meter within the digital multimeter, and this presentation may take the form of an analog bipolar electrical signal.

Signal source 102 is connected to absolute value converter 104, such that the output of signal source 102 is sent as an input into absolute value converter 104. The output of signal source 102 may be a bipolar signal. Absolute value converter 104 may be an implementation of an absolute value circuit and may convert the output of signal source 102 into a unipolar signal. Absolute value converter 104 is connected to voltage to frequency converter 106 such that the unipolar signal of absolute value converter 104 is sent as an input to voltage to frequency converter 106.

In these illustrative examples, voltage to frequency converter 106 may generate a repetitive electrical waveform in an audible frequency range based on the magnitude of signal source 102. A repetitive electrical waveform is a waveform that has some pattern or shape that recurs regularly with a consistent period of recurrence related to the reciprocal of the rate or frequency or recurrence. In these examples, the unipolar signal output from absolute value converter 104 has the same value of magnitude as the signal source 102. However, in other implementations, the unipolar signal output from absolute value converter 104 may be related to the magnitude of signal source 102 by a scale factor or gain.

The audible frequency generated by voltage to frequency converter 106 may also be referred to as the pitch. As the magnitude of signal source 102 changes, the pitch or audible frequency generated by voltage to frequency converter 106 also changes in a proportional manner. The term proportional, as used herein, means that there is a generally monotonic but not necessarily linear dependence of frequency on voltage. In other words, the audible frequency generated by voltage to frequency converter 106 and the magnitude of signal source 102 may change together with monotonic or consistent behavior, and may or may not be related in a constant ratio. However, a nearly constant ratio or linear relationship between the audible frequency and magnitude of signal source 102 is preferred.

For example, changes in the audible frequency are made linearly proportional, logarithmically proportional, or exponentially proportional to the changes in the magnitude of signal source 102. In some implementations, the audible frequency may change in some other monotonically or consistently proportional manner. The output of voltage to frequency converter 106 is sent into waveform changer 110.

Polarity detector 108 also receives signal source 102 as input. In these illustrative examples, polarity detector 108 may detect whether signal source 102 has a positive polarity or negative polarity. This distinction between positive and negative polarity is a necessary feature of these advantageous embodiments because many analog signals may achieve both negative and positive values. Polarity detector 108 may generate a polarity control signal based on the polarity detected from signal source 102. The output of polarity detector 108 is sent to waveform changer 110.

Waveform changer 110 may be an implementation of a waveform changer circuit and may noticeably change the audible sound produced by electrical to audio transducer 112 based on the output of polarity detector 108. Waveform changer 110 allows an operator to discern a noticeably different sound when the polarity of signal source 102 is positive compared to when the polarity of signal source 102 is negative, while the underlying audible frequency or pitch related to the magnitude of signal source 102 remains unchanged. The output of waveform changer 110 is sent to electrical to audio transducer 112.

In these examples, electrical to audio transducer 112 may take the form of a loudspeaker, headphones, or some other suitable electrical to audio transducer that may produce an audible sound. Thus, based on noticeably different audible sounds and changes in pitch, the operator may determine changes in the polarity as well as in the magnitude of signal source 102.

The illustration of electrical to audible signal measurement apparatus 100 in FIG. 1 is not meant to imply physical or architectural limitations that preclude implementations in different advantageous embodiments. In some advantageous embodiments, additional features and/or functions may be present in addition to or in place of the ones illustrated in FIG. 1. The descriptions of the different functional components and their functions are not meant to limit the manner in which the different functions may be implemented.

The different functional components may be implemented using different types of circuits and/or designs depending on the particular embodiment. The different components illustrated for electrical to audible signal measurement apparatus 100 take the form of functional components and are not meant to imply the use of any particular circuit and/or device. Also, some functions may be combined with other functions into a single physical component, while other functions may be divided into additional physical components.

For example, in another advantageous embodiment, signal source 102 may be included within housing 114, or conversely, the elements within housing 114 may instead be included within signal source 102, such that electrical to audible signal measurement apparatus 100 takes the form of a single physical unit. In other advantageous embodiments, electrical to audio transducer 112 may be a separate component located outside of housing 114.

In still other advantageous embodiments, voltage to frequency converter 106 may be comprised of two or more separate physical components and/or devices. For example, voltage to frequency converter 106 may include a voltage to frequency converter and a waveform changer. Further, voltage to frequency converter 106 may include a frequency divider to increase the audible energy of the signal.

Figure 2:
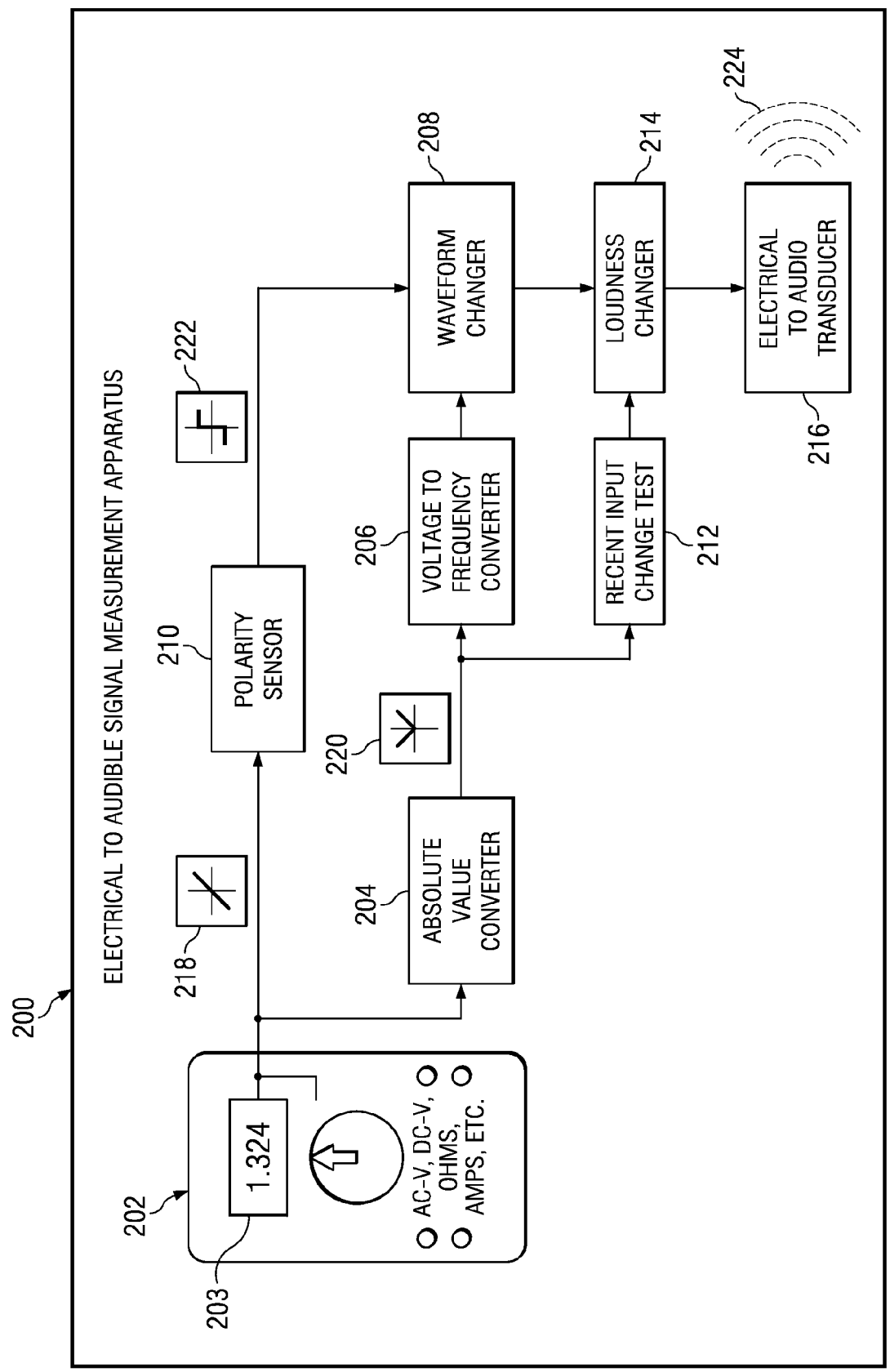
FIG. 2 is a functional diagram illustrating an electrical to audible signal measurement apparatus depicted in accordance with an advantageous embodiment.

With reference now to FIG. 2, a functional diagram illustrating an electrical to audible signal measurement apparatus is depicted in accordance with an advantageous embodiment. Electrical to audible signal measurement apparatus 200 is an example of one implementation of electrical to audible signal measurement apparatus 100 in FIG. 1.

In this example, electrical to audible signal measurement apparatus 200 includes digital multimeter 202, absolute value converter 204, voltage to frequency converter 206, waveform changer 208, polarity sensor 210, recent input change test 212, loudness changer 214, and electrical to audio transducer 216. In these illustrative examples, the different functional components may be implemented using various known circuits and combinations of circuits.

Digital multimeter 202, in this example, is one example of an implementation of signal source 102 in FIG. 1. Digital multimeter 202 may include a digital panel meter such as, for example, digital panel meter 203, which receives a signal generated within digital multimeter 202 as a bipolar analog voltage value. This signal may be sampled and sent as an input to the various functional components of electrical to audible signal measurement apparatus 200.

In this example, digital multimeter 202 outputs an electrical signal in the form of bipolar signal 218 to internal digital panel meter 203. In other circumstances, digital multimeter 202 may output a unipolar signal. Digital multimeter 202 may output bipolar signals when measuring signals that change polarity, such as voltage and current signals, and may output unipolar signals when measuring parameters that have only positive values, such as resistance.

Bipolar signal 218 may be sent into absolute value converter 204. In this depicted example, absolute value converter 204 generates unipolar signal 220. Unipolar signal 220 is the absolute value or the magnitude of the value of bipolar signal 218. In other words, all values for unipolar signal 220 are positive values of substantially equal magnitude to bipolar signal 218.

Unipolar signal 220 may be sent as an input into voltage to frequency converter 206. Voltage to frequency converter 206 is an illustrative example of one implementation of voltage to frequency converter 106 in FIG. 1. Voltage to frequency converter 206 converts unipolar signal 220 into an electrical waveform signal in the audible frequency range that may be sent as an input into a waveform changer, such as, for example, waveform changer 208. In this depicted example, waveform changer 208 is one illustration of an implementation of waveform changer 110 in FIG. 1.

In these illustrative examples, unipolar signal 220 may also be sent as an input into recent input change test 212. Recent input change test 212 determines whether a change has occurred in bipolar signal 218 within some selected period of time. Depending on whether a recent change has occurred in bipolar signal 218, recent input change test 212 outputs a control signal to be sent as an input into loudness changer 214. This control signal determines whether to attenuate and/or mute audible sound 224 ultimately produced by electrical to audible signal measurement apparatus 200.

In these illustrative examples, bipolar signal 218 may also be sent as an input signal into polarity sensor 210. Polarity sensor 210 is one depicted example of an implementation of polarity detector 108 in FIG. 1. Polarity sensor 210 detects the polarity of bipolar signal 218 as being either positive or negative. Polarity sensor 210 then generates a polarity control signal such as, for example, polarity control signal 222. Polarity control signal 222 may be then sent as an input to waveform changer 208 to control waveform changer 208.

Waveform changer 208 uses polarity control signal 222 to change the waveform generated by voltage to frequency converter 206 and thus, change the sound of audible sound 224, while the underlying audible frequency or pitch related to the magnitude of bipolar input signal 218 remains unchanged. Depending on the polarity of bipolar signal 218, waveform changer 208 may change the waveform by selecting a different type of waveform such as one of, for example, a sine waveform, a square waveform, a saw-tooth waveform, a triangle waveform, a waveform modulated by tremolo or some other distinct modulation, or some other type of waveform.

By changing the waveform generated by voltage to frequency converter 206, a noticeably different sound may be produced when the polarity of bipolar signal 218 is positive compared to when the polarity of bipolar signal 218 is negative. Again, the underlying audible frequency or pitch related to the magnitude of bipolar signal 218 remains unchanged. The waveform generated by waveform changer 208 is sent as an input into loudness changer 214.

Loudness changer 214 uses the control signal generated by recent input change test 212 to change the loudness or amplitude of the waveform generated by waveform changer 208. In these examples, loudness changer 214 reduces the amplitude of the waveform that may take the form of audible sound 224. Audible sound 224 may thus be attenuated and/or muted. Additionally, the sound may decrease gradually over time rather than abruptly when bipolar signal 218 does not change for some selected period of time.

In this manner, audible sound 224 will have a level that is low enough to not be annoying and/or may be muted when no changes are occurring in bipolar signal 218. The period of time used for determining whether to attenuate audible sound 224 may be adjusted or set depending on the particular preferences of the user. Audible sound 224 is generated by electrical to audible signal measurement apparatus 200 so that audible sound 224 is neither attenuated nor muted when bipolar signal 218 has recently changed. In some advantageous embodiments, the loudness of audible sound 224 may be reduced rather than muted.

In these illustrative examples, the selectively attenuated waveform generated by loudness changer 214 may be sent as an input into electrical to audio transducer 216. Electrical to audio transducer 216 is one example of an implementation of electrical to audio transducer 112 in FIG. 1. Electrical to audio transducer 216 generates audible sound 224 based on the polarity and magnitude of bipolar signal 218, as well as whether recent changes to bipolar signal 218 have occurred.

The illustration of electrical to audible signal measurement apparatus 200 in FIG. 2 is not meant to imply physical or architectural limitations to the manner in which other advantageous embodiments may be implemented. For example, in some advantageous embodiments, recent input change test 212 and loudness changer 214 may be omitted. In yet other advantageous embodiments, additional controls may be included. Further, other circuits may be used to make other audible presentations when selected measurements are received for bipolar signal 218. As yet another example, in some advantageous embodiments, one or more of the different circuits illustrated for electrical to audible signal measurement apparatus 200 may be implemented as a single circuit and/or chip depending on the particular implementation.

As an example, a number of different devices and/or circuits may be used for the different functional components as depicted in FIG. 2. For example, digital multimeter 202 may be implemented using any currently available digital multimeters or any instrument that incorporates a digital panel meter. Furthermore, the method as presented can apply to any instrument with an analog meter as well. Though most instruments with analog meters are inherently unipolar and use meter movements with zero as an extreme input and display parameter, such instruments are sometimes made with center-zero analog meter movements that would benefit equally from this method.

As another example, absolute value converter 204 may be implemented using one or more operational amplifiers with one or more diodes in circuits as commonly known to those skilled in the art. Voltage to frequency converter 206 may be implemented using various available circuits and may be also referred to as a voltage or current controlled audio oscillator or function generator.

For example, voltage to frequency converter 206 may be implemented using a component having a part number LM331, available from National Semiconductor Corporation, or part number ADVFC32, available from Analog Devices, Inc. These devices, used preferably in some advantageous embodiments, are precision voltage to frequency converters, which output a train of narrow pulses rather than a symmetrical waveform and so may require an additional circuit to increase audible energy by increasing duty cycle. The waveform generated by voltage to frequency converter 206 has a frequency of recurrence.

In other advantageous embodiments, voltage to frequency converter 206 may include a waveform generator component that may be implemented using various common circuits to synthesize audio waveforms that sound different because of their differing harmonic content. In still other advantageous embodiments, waveform changer 208 may be implemented using analog gates to route one of two selected waveforms. Alternatively, in waveform changer 208, an analog gate or multiplier may be used to change the sound of a waveform by adding tremolo to impart a distinctive sound for one of the two possible polarities. In these illustrative examples, tremolo in a waveform is a regular and repetitive variation in the amplitude of the waveform at some noticeable frequency. In other advantageous embodiments, many other forms of modulation or distortion of the waveform may serve equally well to produce distinct and distinguishable audible sounds under the control of polarity control signal 222.

Electrical to audio transducer 216 may be implemented using a loudspeaker or other device that converts electrical signals to audio sounds depending on the particular implementation. Loudness changer 214 may be an analog gate in these examples or any other circuit that enables control of signal amplitude. Recent input change test 212 may be implemented using a logical signal flow as described below in FIG. 6. One type of recent input change test determines whether the input electrical signal or the unipolar signal has changed or remained stable within a recent period of time, while an alternative type determines whether the frequency from the voltage to frequency converter has changed or remained stable in a recent period of time.

Commercially available communication products, such as digital signal processors, perform this function when they eliminate annoying heterodyne whistles that appear in radio reception for short wave listening or amateur radio usage. Of course, these different circuits are provided for illustrative purposes only and are not meant to limit the circuits that may be used to implement these different components.

Figure 3:
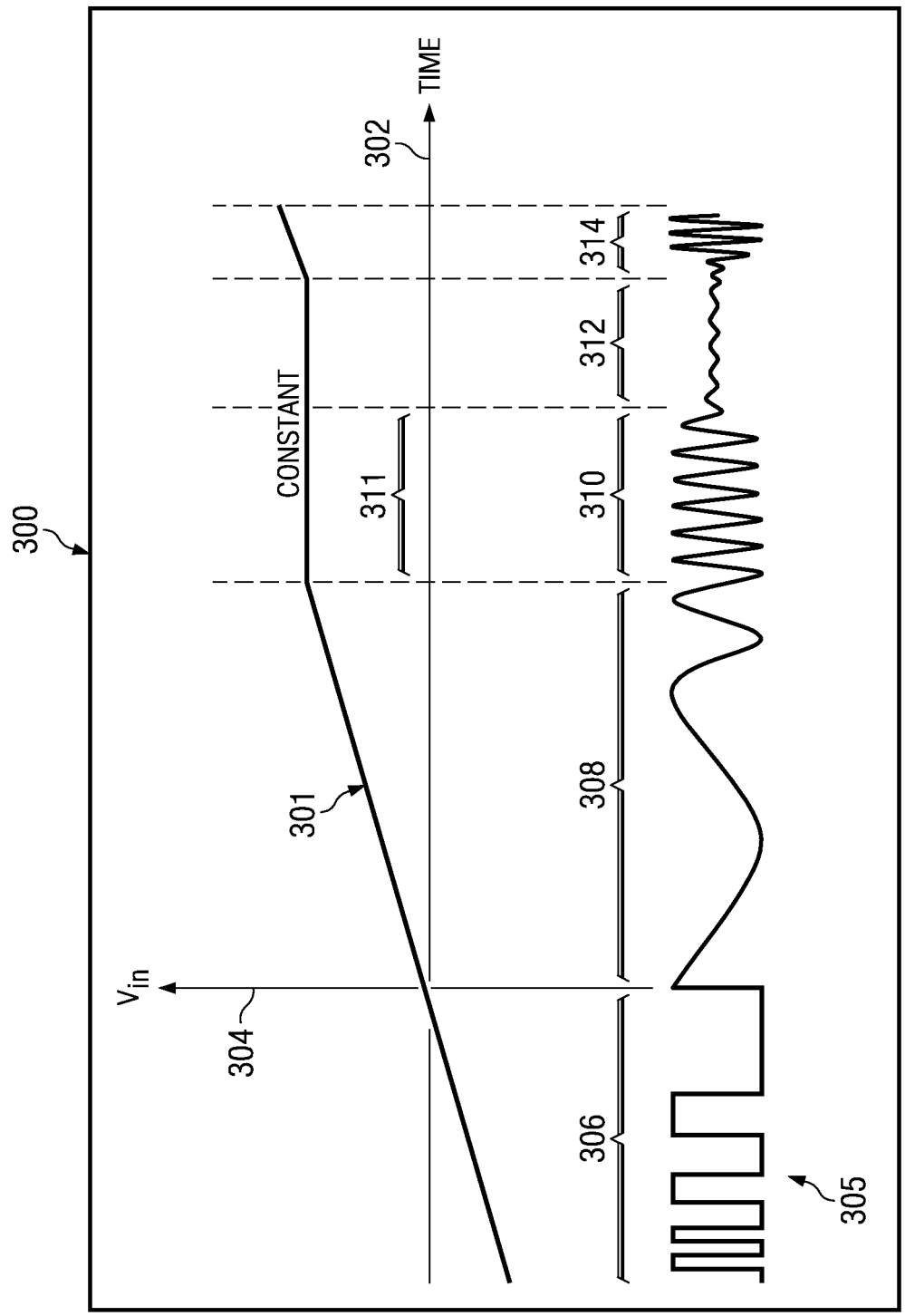
FIG. 3 is an illustration of the types of waveforms that may be generated by a waveform changer depicted in accordance with an advantageous embodiment.

With reference now to FIG. 3, an illustration of the types of waveforms that may be generated by a waveform changer is depicted in accordance with an advantageous embodiment. Graph 300 provides an example of an input signal and a waveform that may be produced by waveform changer 208 in electrical to audible signal measurement apparatus 200 in FIG. 2.

Voltage input signal 301 represents one example of a bipolar input signal, such as bipolar signal 218, which may be measured by electrical to audible signal measurement apparatus 200. Horizontal axis 302 represents time and vertical axis 304 represents the value of voltage input signal 301 as voltage. Waveform 305 represents one example of a waveform that may be produced by waveform changer 208. Waveform 305 depicts a waveform that undergoes a change by waveform changer 208 from a square wave to become a sine wave as the polarity of input signal 301 changes from negative to positive.

In these examples, waveform section 306 represents the square wave that is generated in response to a negative polarity of voltage input signal 301. Waveform section 308, waveform section 310, waveform section 312, and waveform section 314 represent the sine wave portions of waveform 305 generated in response to positive polarities of voltage input signal 301.

Further, waveform section 310 illustrates a sine wave at a constant frequency that is generated when voltage input signal 301 stops varying. In waveform section 312, waveform 305 is muted following time delay 311 during which voltage input signal 301 is invariant. In waveform section 314, waveform 305 is unmuted without delay in response to renewed signal variation.

In this example, waveform 305 has a lower frequency or pitch for lower levels of voltage input signal 301 indicating the presence and behavior of a voltage to frequency converter, such as, for example, voltage to frequency converter 206 in FIG. 2. Further, due to a lesser amplitude, waveform section 312 would be heard as a quieter audible sound or would not be heard at all.

Figure 4:
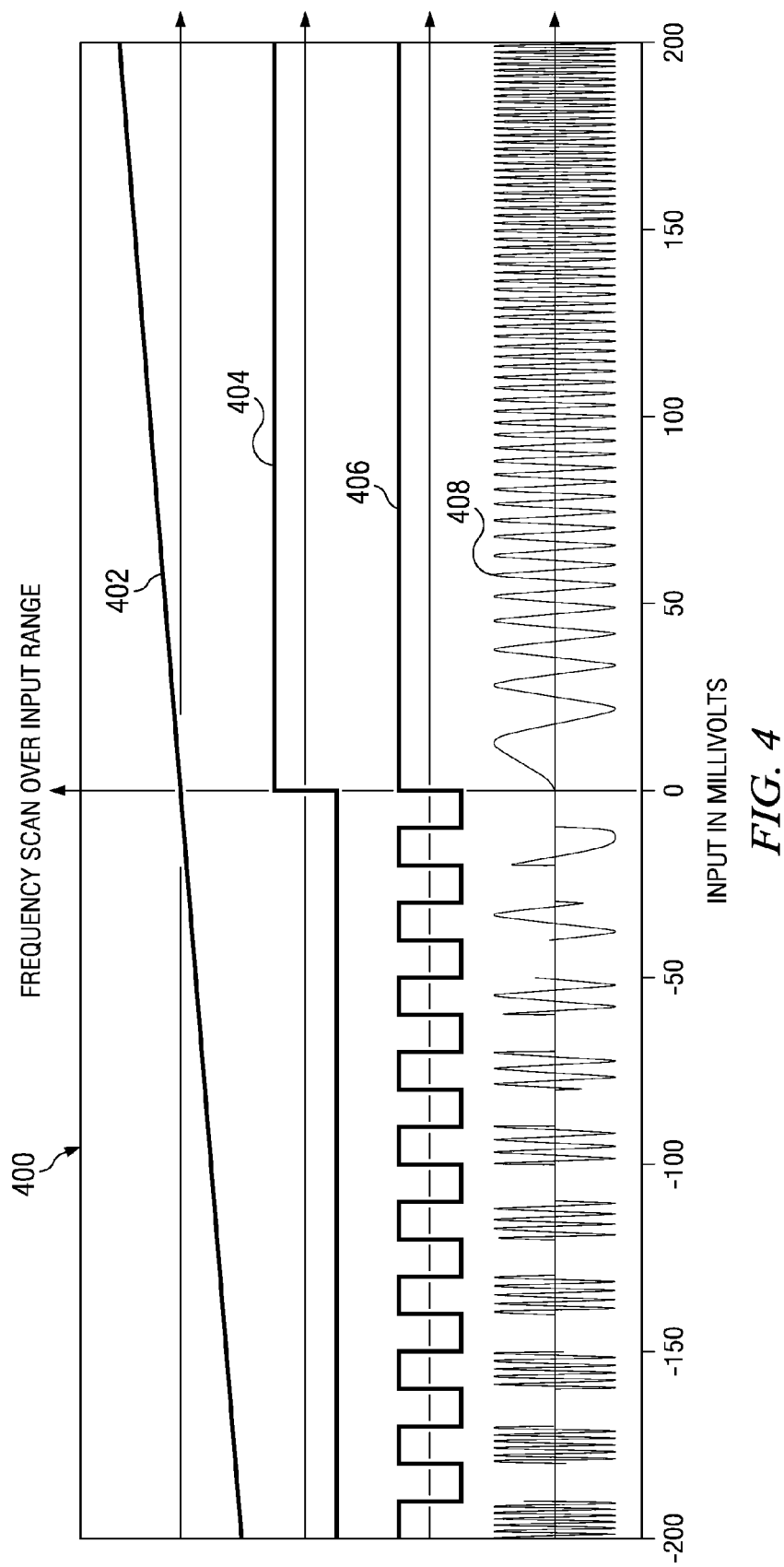
FIG. 4 is an illustration describing the changing of a waveform by a waveform changer depicted in accordance with an advantageous embodiment.

With reference now to FIG. 4, an illustration describing the changing of a waveform by a waveform changer is depicted in accordance with an advantageous embodiment. Graph 400 illustrates one example of an implementation of a waveform changer such as waveform changer 208 in FIG. 2. This implementation involves the modification of a waveform generated by a voltage to frequency converter, such as voltage to frequency converter 206 in FIG. 2, by applying a tremolo signal to the waveform to impart distinctive sounds to the waveform in response to positive and negative polarities of a bipolar signal received as input.

For example, waveform 402 represents a voltage input signal, such as voltage input signal 301 in FIG. 3. Waveform 404 represents a polarity control signal, such as polarity control signal 222, generated by a polarity sensor, such as polarity sensor 210, in response to the voltage input signal of waveform 402 as it varies from a negative extreme value, through zero, to a positive extreme value. The polarity control signal has a value of −1 when the polarity is negative and a value of +1 when the polarity is positive. The polarity control signal may be at any suitable electrical signal levels, often called logic levels.

Waveform 406 represents a tremolo waveform that may be generated to control one implementation of waveform changer 208 in FIG. 2. In this implementation, waveform changer 208 uses the polarity control signal to control whether a tremolo waveform is superimposed on, or otherwise modulates the output waveform from voltage to frequency converter 206. A polarity control signal of value −1 in this example enables the tremolo waveform to be superimposed on the output waveform, and a polarity control of value +1 disables the superimposition of the tremolo waveform.

The results of enabling the tremolo waveform to be superimposed on the output waveform and disabling the tremolo waveform from being superimposed on the output waveform are depicted in waveform 408. Waveform 408 represents the output of the waveform changer in these examples. In this way, a waveform changer may use tremolo to distinctly change the sound of the waveform based on positive or negative polarity.

Figure 5:
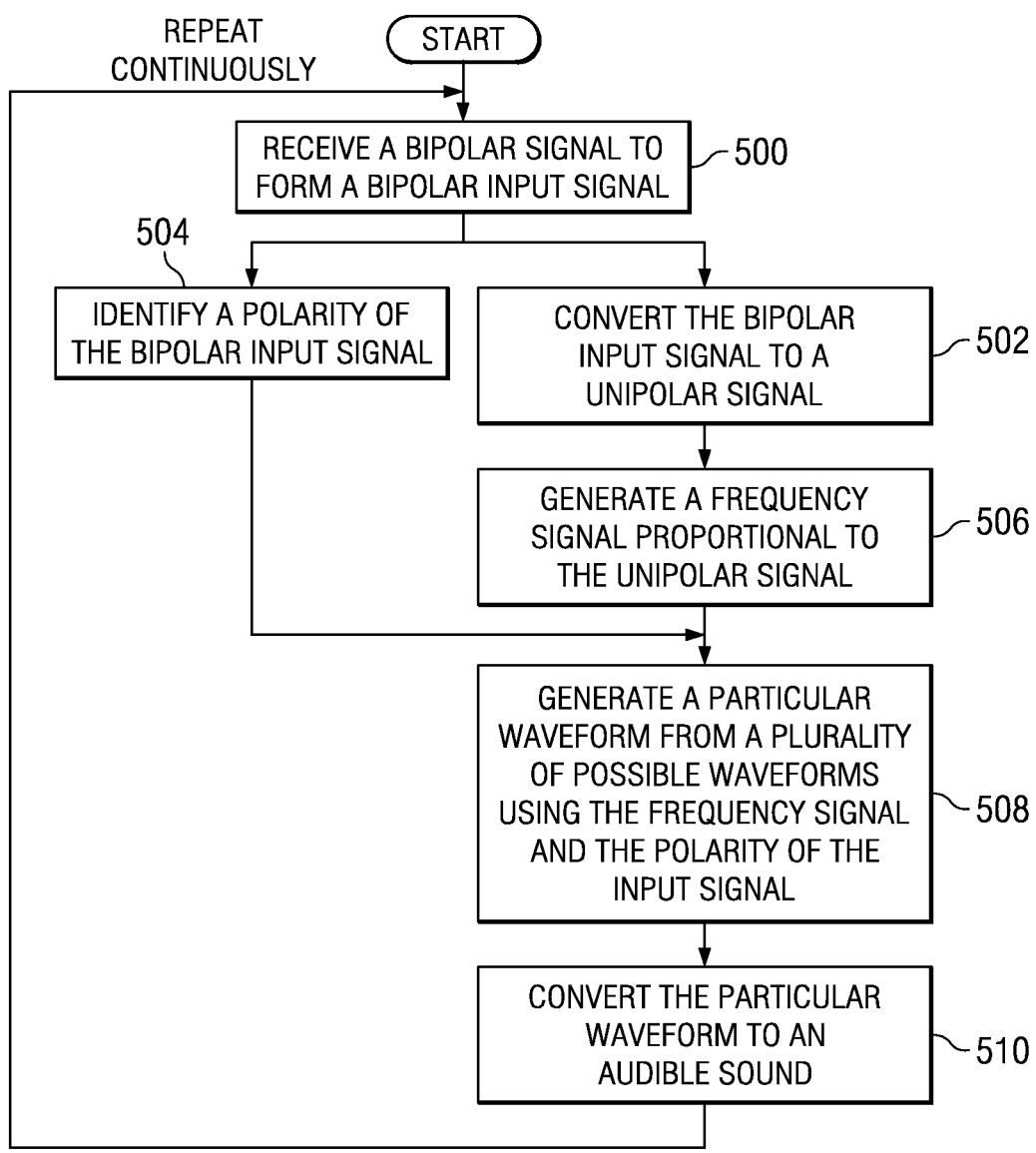
FIG. 5 is a flowchart of a process for presenting electrical measurements depicted in accordance with an advantageous embodiment.

With reference now to FIG. 5, a high-level flowchart of a process for presenting electrical measurements is depicted in accordance with an advantageous embodiment. The process illustrated in FIG. 5 may be implemented in a device such as, for example, electrical to audible signal measurement apparatus 100 in FIG. 1.

The process receives a bipolar signal to form a bipolar input signal (operation 500). The process then identifies the polarity of the bipolar input signal (operation 504).

The process simultaneously converts the bipolar input signal to a unipolar signal (operation 502) that represents the magnitude but not the polarity of the bipolar input signal. The process then generates a frequency signal proportional to the unipolar signal (operation 506). In other words, the frequency signal generated in operation 506 uses the unipolar signal and has a frequency based on and proportional to the unipolar signal.

The process then generates a particular waveform from a plurality of possible waveforms using the frequency signal and the polarity of the bipolar input signal (operation 508). In operation 508, the generation of the particular waveform may be by selecting a particular waveform from the plurality of possible waveforms based on the frequency signal and the polarity of the bipolar input signal. In some advantageous embodiments, operation 508 may occur by modifying the particular waveform by superimposing a modulation such as, for example, tremolo. Of course, the particular waveform may be modified by some other type of modulation.

The process then converts the particular waveform to an audible sound (operation 510), with the process returning to and beginning again at operation 500. The process repeats continuously in response to new input signals.

Figure 6:
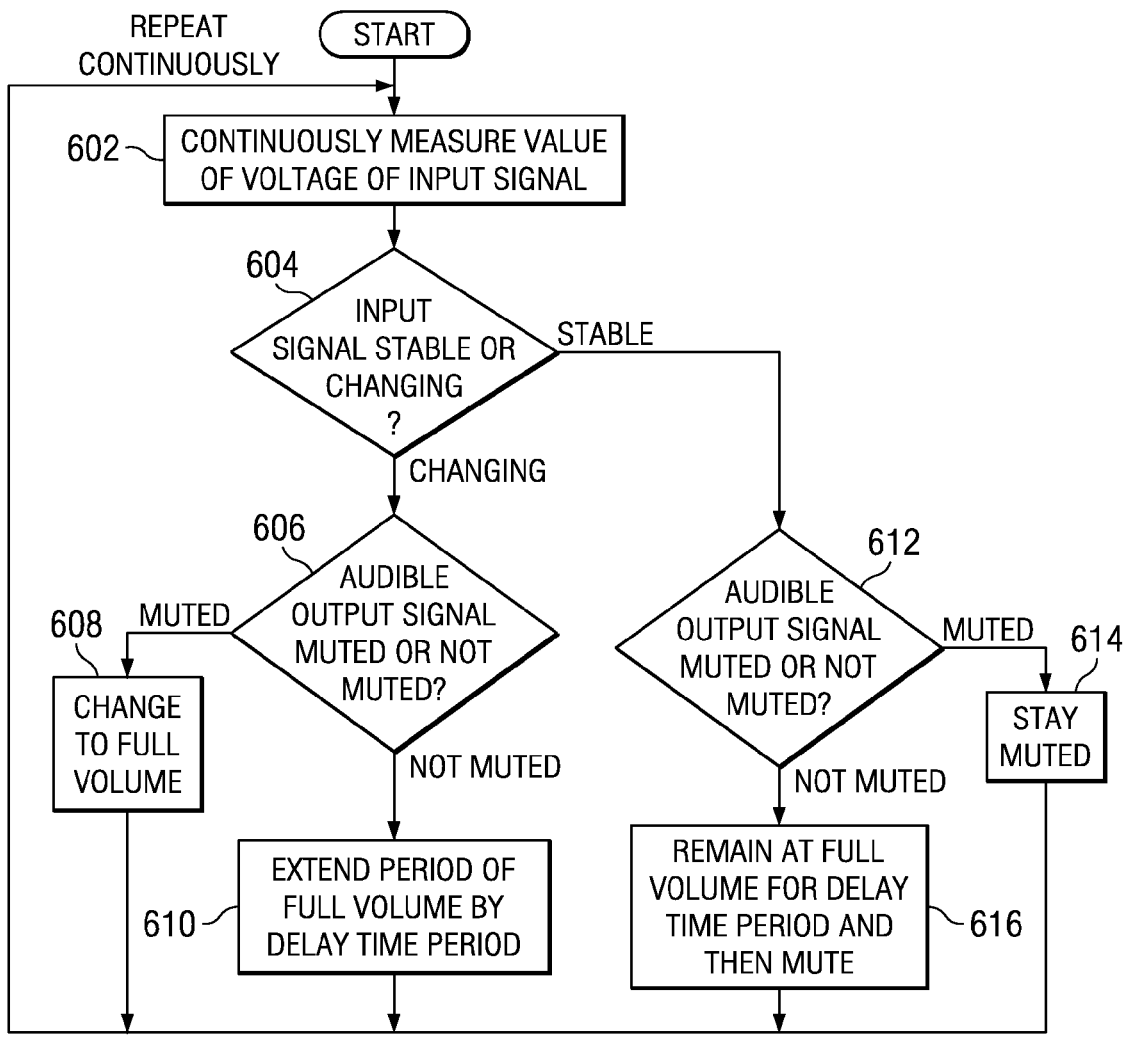
FIG. 6 is a flowchart of a process performing a recent input change test depicted in accordance with an advantageous embodiment.

With reference now to FIG. 6, a flowchart of a process performing a recent input change test is depicted in accordance with an advantageous embodiment. The process illustrated in FIG. 6 may be implemented in a functional component such as, for example, recent input change test 212 of electrical to audible signal measurement apparatus 200 in FIG. 2.

The process begins by continuously measuring the value of the voltage of an input signal (operation 602). In these advantageous embodiments, the process may measure the value of the voltage of any type of signal from any appropriate input or output such as, for example, a bipolar input signal output from a signal source, a unipolar signal output from an absolute value converter, a frequency signal output from a voltage to frequency converter, or some other type of signal from some other input or output. In other advantageous embodiments, operation 602 may involve measuring a signal parameter other than voltage, such as, for example, current or frequency.

The process then controls loudness based on a determination as to whether the measured value of the input signal is stable or changing (operation 604). If the measured value of the input signal value is changing, the process then follows an operational path determined by whether the audible output signal is muted or not muted (operation 606). If the audible output signal is muted, the process changes the audible output signal to full volume (operations 608). Otherwise, if the audible output signal is not muted, the process extends the period of full volume by a delay time period (operation 610).

With reference again to operation 604, if the input signal is stable, the process then follows an operational path determined by whether the audible output signal is muted or not muted (operation 612). If the audible output signal is muted, the process maintains this condition and the audible output signal stays muted (operations 614). Otherwise, if the audible output signal is not muted, the process then leaves the audible output signal at full volume for the delay time period and then mutes the audible output signal (operation 616). After operations 608, 610, 614, and 616, the process then returns to and begins again at operation 602, with the process repeating continuously in response to new input signals.

Figure 7:
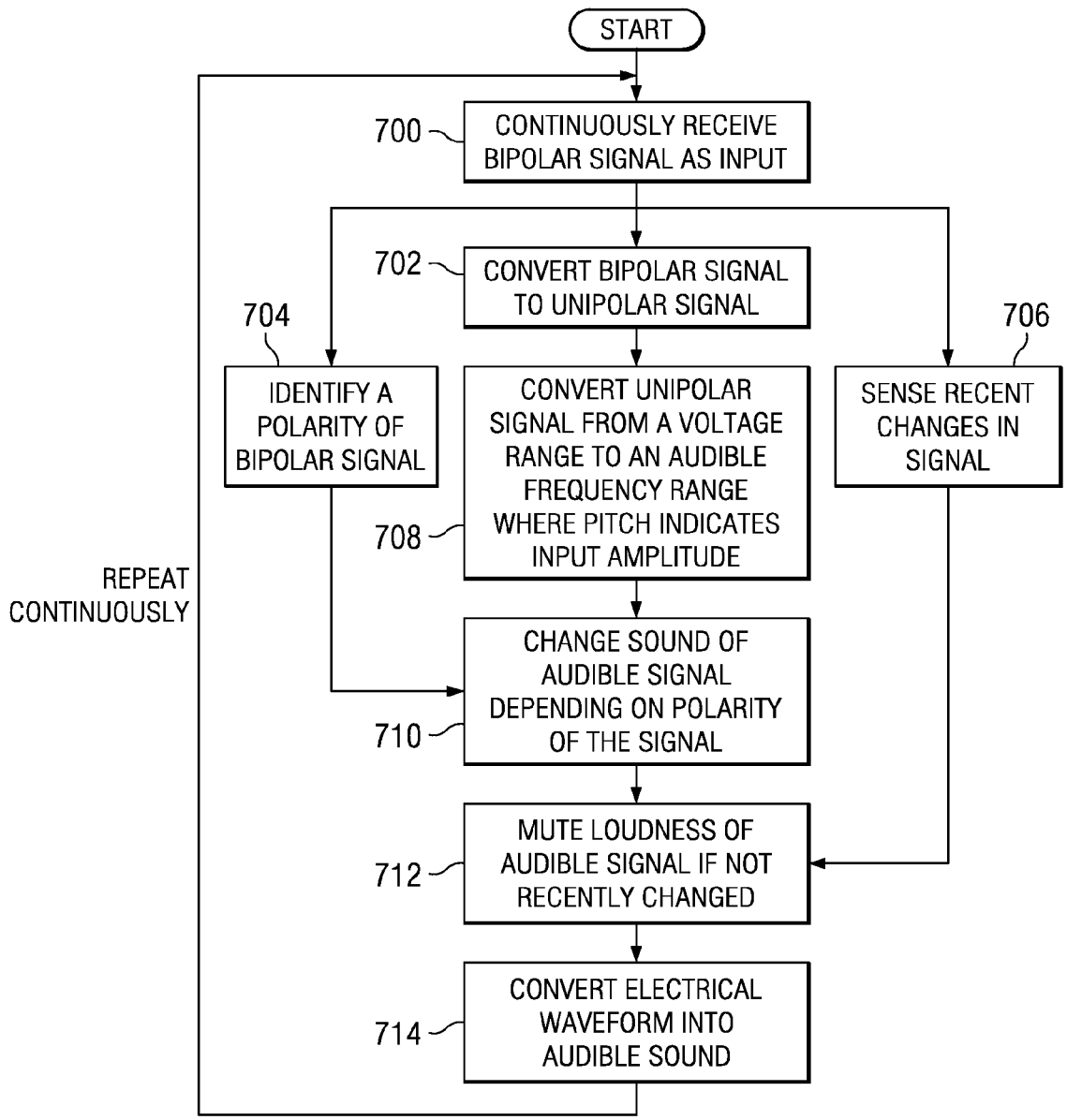
FIG. 7 is a flowchart of a process for audibly presenting bipolar electrical measurements depicted in accordance with an advantageous embodiment.

With reference now to FIG. 7, a flowchart of a process for audibly presenting bipolar electrical measurements is depicted in accordance with an advantageous embodiment. The process illustrated in FIG. 7 may be implemented using a device such as, for example, electrical to audible signal measurement apparatus 200 in FIG. 2.

The process begins by continuously receiving a bipolar signal as an input (operation 700). In operation 700, this bipolar signal may be a voltage that may be received from a digital multimeter such as, for example, digital multimeter 202 in FIG. 2 or the input to a digital panel meter within any other instrument. This signal may be, and often is, between plus and minus 200 millivolts, depending on the particular implementation, but the method is adaptable to any other such input range. The process then performs a number of different operations in parallel. The bipolar signal is converted into a unipolar signal (operation 702). Additionally, the polarity of the bipolar signal is identified (operation 704), and at the same time, a determination is made as to whether recent changes have been sensed in the bipolar signal (operation 706). In operation 706, a determination is made as to whether a change in the bipolar signal has occurred within a selected preceding period of time. This determination is used to control the loudness of the audible presentation of the measurement.

Following operation 702, the unipolar signal is converted from a voltage range to a frequency signal in an audible frequency range where the frequency or pitch indicates input amplitude (operation 708). This conversion may generate a suitable audible waveform. In these examples, the waveform may be a square wave or a sine wave, though any distinctive sounding waveform would serve equally well. The process then changes the sound of the audible signal depending on the identification of the polarity of the signal in operation 704 (operation 710). The positive polarity and the negative polarity are each associated with a distinct waveform so as to produce distinguishable sounds.

The process then makes a change to the amplitude of the electrical waveform so as to affect the ultimate loudness of the audible signal (operation 712). The control of loudness of the resulting waveform in operation 712 is performed based on the results of operation 706 in which any recent changes to the bipolar signal that have occurred are sensed. If recent changes have not been sensed, operation 712 controls the waveform by attenuating and/or muting the waveform. The waveform may be modified in loudness by changing the amplitude of the waveform. In other advantageous embodiments, the waveform may be entirely blocked from being sent for transformation into an audible tone. After the amplitude has been controlled in operation 712, the process then converts the electrical waveform into an audible sound (operation 714). After operation 714, the process returns to and begins again at operation 700 with the process repeating continuously in response to new input signals.

Thus, the different advantageous embodiments provide a method and apparatus for presenting electrical measurements. Electrical measurements may be converted into audible tones in which the pitches vary depending on the magnitudes of the measurements. Further, whether a measurement is a positive or negative value also may be identified by a user because a different waveform is used depending on whether the polarity of the measurement is positive or negative. The types of waveforms chosen for a positive and a negative measurement are selected in a manner so that a user is capable of distinguishing between the different waveforms by distinguishing between their sounds.

Thus, the different advantageous embodiments provide a capability for an operator to focus fully on making measurements, changes, and/or adjustments in a circuit. The user is able to focus their sight on the circuit without having to split or shift focus to look at the display of a multimeter or other device to determine whether changes in measurements have occurred and the nature of those changes. While this method is not suitable for setting parameters to the full resolution and accuracy of the original instrument, this method is advantageous for performing measurements that maximize or minimize a measured parameter and for noting relative changes while making adjustments or other circuit changes.

The description of the different advantageous embodiments has been presented for purposes of illustration and description, and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An electrical to audible signal measurement apparatus comprising:
    an absolute value converter that converts a bipolar input signal into a unipolar signal;
    a voltage to frequency converter connected to the absolute value converter that generates a frequency signal proportional to the unipolar signal;
    a polarity detector that identifies a polarity of the bipolar input signal to form a polarity control signal;
    a waveform changer connected to the voltage to frequency converter and the polarity detector that generates a number of different waveforms in an audio frequency range in response to receiving the frequency signal from the voltage to frequency converter and in response to the polarity control signal, the number of different waveforms including at least a first waveform for positive values and a second waveform for negative values, wherein the number of different waveforms comprises any mutually distinctive sounding waveforms including at least one waveform modulated by tremolo; and
    an audio transducer connected to the waveform changer configured to outputting an audible tone from a selected waveform from the number of different waveforms, at least one audible tone corresponding to the first waveform for positive values and a second audible tone corresponding to the second waveform for negative values.

2. The electrical to audible signal measurement apparatus of claim 1 further comprising:
    a digital multimeter, wherein the digital multimeter generates the bipolar input signal.

3. The electrical to audible signal measurement apparatus of claim 1 further comprising:
    a recent input change test capable of determining whether a change in the bipolar input signal has occurred within a selected period of time and controlling whether a loudness of the audible tone changes.

4. The electrical to audible signal measurement apparatus of claim 3 further comprising:
    a loudness changer connected to the recent input change test and the waveform changer, wherein the loudness changer is configured to lower the loudness of the audible tone under control of the recent input change test after a selected period of time.

5. The electrical to audible signal measurement apparatus of claim 4, wherein the loudness is changed by one of attenuating the loudness of the audible tone and muting the audible tone.

6. The electrical to audible signal measurement apparatus of claim 1 further comprising:
    a housing, wherein the absolute value converter, the voltage to frequency converter, the polarity detector, and the waveform changer are located within the housing.

7. The electrical to audible signal measurement apparatus of claim 1, wherein the waveform changer generates a particular waveform from the number of different waveforms by selecting a particular waveform from the number of different waveforms based on the polarity control signal and the frequency signal from the voltage to frequency converter.

8. The electrical to audible signal measurement apparatus of claim 1, wherein the waveform changer generates a particular waveform from the number of different waveforms by modifying a particular waveform from the number of different waveforms based on the polarity control signal and the frequency signal from the voltage to frequency converter.

9. The electrical to audible signal measurement apparatus of claim 1, wherein the electrical to audio transducer is selected from one of a loudspeaker and headphones.

10. The electrical to audible signal measurement apparatus of claim 1, wherein the number of different waveforms is selected from the group consisting of a sine waveform, a square waveform, a saw-tooth waveform, a triangle waveform, and a waveform modulated by tremolo.

11. The electrical to audible signal measurement apparatus of claim 10, wherein the waveform modulated by tremolo is one of the sine waveform, the square waveform, the saw-tooth waveform, and the triangle waveform.

12. The electrical to audible signal measurement apparatus of claim 1 wherein, the audible tone further comprises a pitch that varies with a magnitude of the unipolar signal and that is different for positive or negative values.

13. An apparatus comprising:
    an absolute value circuit capable of converting a bipolar input signal into a unipolar signal;

a polarity sensor capable of identifying a polarity of the bipolar input signal and generating a polarity control signal;

a frequency generation circuit capable of generating a plurality of different waveforms, each having an audio frequency based on a magnitude of the bipolar input signal and a sound based on a polarity of the bipolar input signal, wherein the plurality of different waveforms comprises any mutually distinctive sounding waveforms including at least one waveform modulated by tremolo comprising one of the sine waveform, the square waveform, the saw-tooth waveform, and the triangle waveform; and an audio transducer connected to the frequency generation circuit capable of outputting an audible tone from the plurality of different waveforms, the audible tone comprising a pitch that varies with a magnitude of the unipolar signal and that is different for positive or negative values.

14. The apparatus of claim 13, wherein the frequency generation circuit comprises:

a voltage to frequency converter driven by the absolute value circuit capable of generating the plurality of different waveforms, each as a frequency signal having a frequency proportional to the unipolar signal; and a waveform changer circuit connected to the voltage to frequency converter capable of selecting a particular waveform from the plurality of different waveforms based on the polarity of the bipolar input signal identified by the polarity sensor to form the particular waveform.

15. The apparatus of claim 13 further comprising:

a sound control circuit connected to the audio transducer, wherein the sound control circuit is capable of determining whether the bipolar input signal has changed within a selected period of time and is capable of changing a loudness of the audible tone based on whether the bipolar input signal has changed within the selected period of time.

16. A method for presenting electrical measurements, the method comprising:

receiving a bipolar signal to form a bipolar input signal;
identifying a polarity of the bipolar input signal;
generating a polarity control signal;
converting the bipolar input signal to a unipolar signal;
generating a frequency signal proportional to the unipolar signal;
generating a particular waveform from a plurality of possible waveforms using the frequency signal, the polarity of the bipolar input signal, and the polarity control signal, wherein the plurality of possible waveforms comprises any mutually distinctive sounding waveforms including at least one waveform modulated by tremolo comprising one of the sine waveform, the square waveform, the saw-tooth waveform, and the triangle waveform; and converting the particular waveform to an audible tone, the audible tone comprising a pitch that varies with a magnitude of the unipolar signal and that is different for positive or negative values.

17. The method of claim 16, wherein the generating a frequency signal step comprises:

changing the unipolar signal to the frequency signal using a magnitude of the unipolar signal with the frequency signal having a frequency proportional to the unipolar signal; and forming the plurality of possible waveforms from the frequency signal.

18. The method of claim 16, wherein the generating a particular waveform step comprises:

selecting the particular waveform from a plurality of possible waveforms using the frequency signal and the polarity of the bipolar input signal.

19. The method of claim 16, wherein the generating a particular waveform step comprises:

modifying the particular waveform using the polarity of the bipolar input signal.

20. The method of claim 16, wherein the plurality of possible waveforms are selected from the group consisting of a sine waveform, a square waveform, a saw-tooth waveform, and a triangle waveform.

21. The method of claim 17, wherein the converting step comprises:

converting the bipolar input signal to the unipolar signal using an absolute value circuit.

22. The method of claim 21, wherein the changing step comprises:

changing the unipolar signal to the frequency signal using a magnitude of the unipolar signal with a voltage to frequency converter.

23. The method of claim 22, wherein the forming step comprises:

selecting a waveform from the plurality of possible waveforms with a waveform changer circuit.

24. The method of claim 22, wherein the forming step comprises:

modulating a single waveform from the plurality of possible waveforms from a waveform changer circuit with another waveform to give the single waveform a characteristic sound.

* * * * *